(12) United States Patent
Hussaini

(10) Patent No.: US 6,479,746 B2
(45) Date of Patent: Nov. 12, 2002

(54) POWER INVERTER WITH COLLAPSING MOUNTING TABS

(75) Inventor: Saied Hussaini, Miami, FL (US)

(73) Assignee: Rally Manufacturing, Inc., Miami, FL (US)

(*) Notice: Subject to any disclaimer, the term of this patent is extended or adjusted under 35 U.S.C. 154(b) by 0 days.

(21) Appl. No.: 09/799,050

(22) Filed: Mar. 6, 2001

(65) Prior Publication Data

US 2002/0125029 A1 Sep. 12, 2002

(51) Int. Cl.$^7$ .................................................. H02G 3/16
(52) U.S. Cl. .................... 174/50; 174/50; 174/138 G; 174/50.54; 174/52.1; 248/420; 248/231.21; 248/220.21; 248/220.22; 403/283; 403/169; 403/286; 403/287; 439/71; 16/291
(58) Field of Search .................... 174/138 E, 138 G, 174/152 R, 399, 826, 50.54, 52.1, 50; 248/420, 231.21, 205.3, 220.21, 220.22, 694; 403/283, 169, 286, 287; 103/12, 68; 312/111; 396/336; 439/71; 16/291

(56) References Cited

U.S. PATENT DOCUMENTS 3,797,169 A * 3/1974 Armstrong .................... 16/341
4,674,149 A * 6/1987 Vetter .......................... 139/103
4,838,180 A * 6/1989 Gutgsell ....................... 108/132
5,613,308 A * 3/1997 Little ............................ 16/375
5,742,478 A    4/1998 Wu

FOREIGN PATENT DOCUMENTS

GB        2165883 A   *   4/1986

* cited by examiner

*Primary Examiner*—Dean A. Reichard
*Assistant Examiner*—Anton Harris
(74) *Attorney, Agent, or Firm*—Liniak, Berenato & White

(57) ABSTRACT

A plurality of mounting feet securely attach a power inverter to a body. The tabs are to be adjustably or pivotally mounted on the under carriage of the power inverter such that they may be positioned by the user when mounting to a body. When mounted, the tabs absorb vibrations from the host body and prevent the power inverter from resulting damage. During shipping or storage the tabs are retracted to the underside of the power inverter to minimize space required by the power inverter. The tabs are made from elastomeric electrical insulator material in order to ensure a proper ground is maintainer as long as the power inverter is secured via the tabs.

18 Claims, 3 Drawing Sheets

POWER INVERTER WITH COLLAPSING MOUNTING TABS

BACKGROUND OF THE INVENTION

1. Field of the Invention

This invention relates generally to convenient and simplified means to fix a power inverter on a host body and, more specifically, this invention provides adjustable mounting tabs placed on the undercarriage of a power inverter to function as pivotal brackets.

2. Description of Related Art

There exists an enormous waste of economy when attempting to fix a power inverter to a host body. Either a mounting feature is absent and the user must find a way to attach the power inverter for themselves, or a bracket is provided by the manufacturer.

Should the manufacturer provide a mounting bracket for the consumer, the bracket is usually bulky and awkward to effectuate mounting. Ultimately, the manufacturer experiences an increase in production costs. Similarly, the increased weight and size of the power inverter increase the costs incurred by the manufacturer during shipping.

Additionally, the mounting features of the prior art are susceptible to vibrations as well as current surges from the host body. These vibrations and current surges are transferred to the power inverter without any absorption or grounding by the mounting bracket. Such conditions can lead to damage to the power inverters and possibly creating a dangerous condition. The conventional mounting brackets also fail to maximize on the width of the mounting base.

It is highly desirable to provide a simple cost effective mounting feature for power inverters and increase profits while decreasing costs. Such a feature should exhibit characteristics that include grounding capability and vibration absorption.

The need therefore exists for a power inverter with a mounting feature incorporated that minimizes costs and facilitates easy shipping while also absorbing host body vibrations and providing adequate grounding ensuring a safe condition.

SUMMARY OF THE INVENTION

It is therefore an advantage of the present invention to provide tabs, adapted to securely attach a power inverter to a body. The tabs are to be pivotally mounted on the under carriage of the power inverter, such that they may be positioned by the user when mounting to a body. The tabs are made from elastomeric electrical insulator material in order to ensure a proper ground is maintained as long as the power inverter is secured via the tabs. This type of material also exhibits vibration absorption characteristics and will minimize the damage to the power inverter resulting from body vibration.

These advantages and other novel features of the present invention will become apparent in the following detailed description of the invention when considered in conjunction with the accompanying drawings.

BRIEF DESCRIPTIONS OF THE DRAWINGS

A better understanding of the present invention will be had when reference is made to the accompanying drawings, wherein identical parts are identified by identical reference numbers and wherein.

DETAILED DESCRIPTION OF THE PRESENT INVENTION

A power inverter, as is well known in the art, is generally box shaped.

Figure 1:
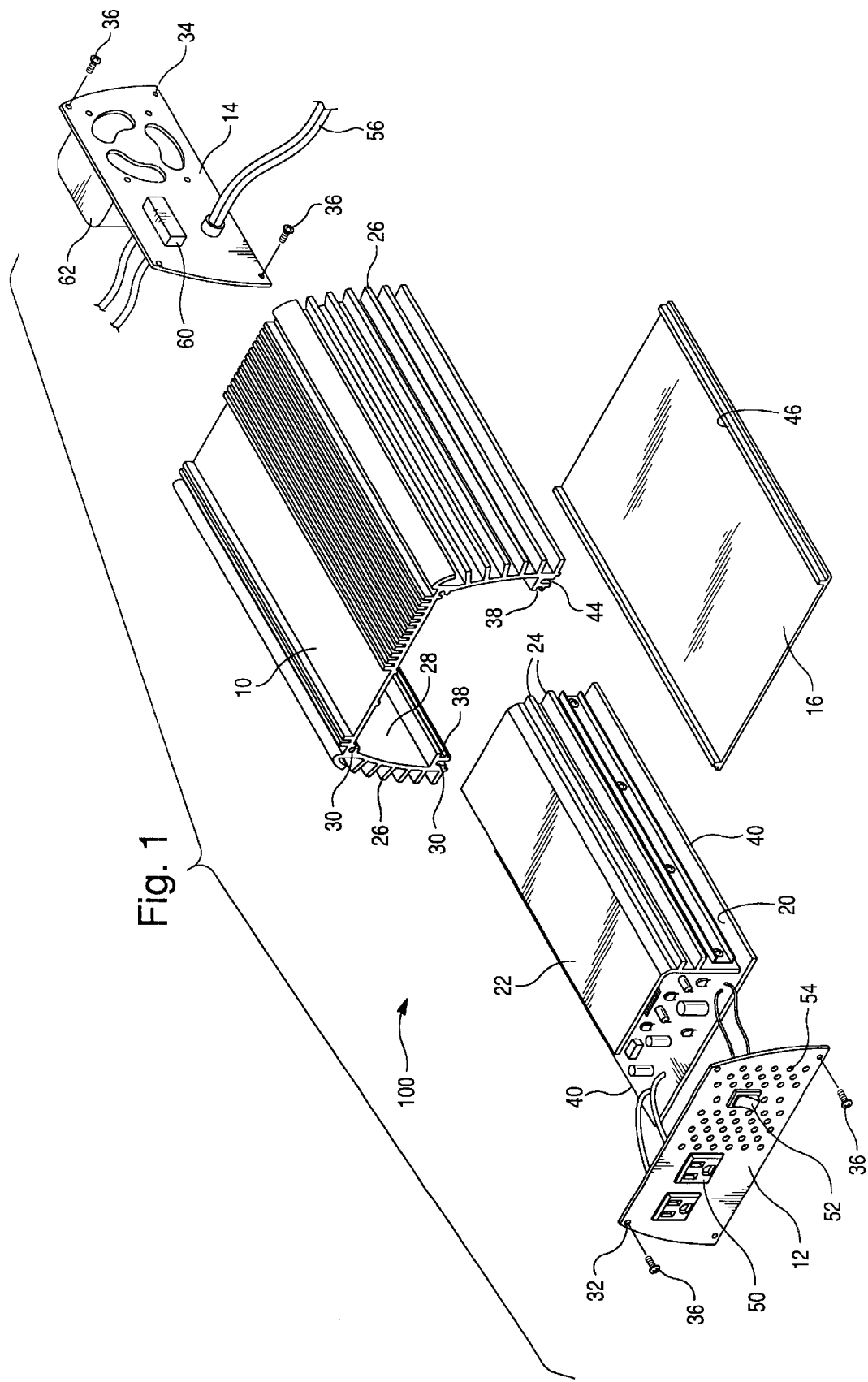
FIG. 1 is an exploded view of a power inverter having a heat dissipating assembly according to the present invention.

Referring to FIG. 1, the main components of the power inverter 100 are substantially enclosed within a housing 10, a front cover plate 12, a rear cover plate 14, and a base plate 16. The main components further include a printed circuit board 20 loaded with conventional power converter elements and the appropriate wiring, as will be understood by those skilled in the art. An L-shaped heat sink plate 22 is mounted within the housing in a manner to be described hereinafter. The L-shaped heat sink plate 22 is shown having heat dissipating fins 24 extending along the side length of the plate.

The exterior of the housing 10 has a plurality of heat dissipating fins 26 extending outwardly from the sides and the top of the housing 10. The interior surface 28 of the housing is provided with slotted, threaded screw holes 30 at the upper and lower corners thereof. The front and rear cover plates 12, 14 are provided with corresponding screw holes 32, 34, respectively, which screws 36 pass through to attach the front and rear cover plates to the housing during assembly. Furthermore the interior sides of the housing are provided with opposing elongated mounting slots 38 through which the printed circuit board edges 40 are inserted into lengthwise. The bottom of the housing 10 has parallel elongated slots 44 for mounting the base plate 16 therein. The base plate 16 has corresponding mating edges 46 that fit into the bottom slots 44 of the housing when the edges 46 are inserted and slid into the slots 44 lengthwise. The remaining surfaces of the interior of the housing are smooth and continuous.

In addition to the screw holes 32 for attachment to the housing 10, the front cover plate 12 is provided with power converted outlets 50 or receptacles, an on/off switch 52, and a plurality of ventilation holes 54 that allow air to pass in or out from the housing interior. The rear cover plate 14 is provided with a power cord 56 with an attached adapter (not shown), a fuse 60, and an optional intake fan 62. It will be noted that the power inverter 100 according to the invention does not necessarily require an intake fan. For example, a 350 Watt power inverted may be equipped with an intake fan, whereas a 150 Watt power inverter may not. Accordingly the fan 62 on the rear cover plate 14 may alternatively be replaced by additional ventilation holes.

The present invention provides mounting feet or tabs 101 adapted to securely attach a power inverter to a body. The mounting feet are preferably pivotally mounted on the under carriage of the power inverter, such that they may be positioned by the user when mounting to a body.

Figure 2:
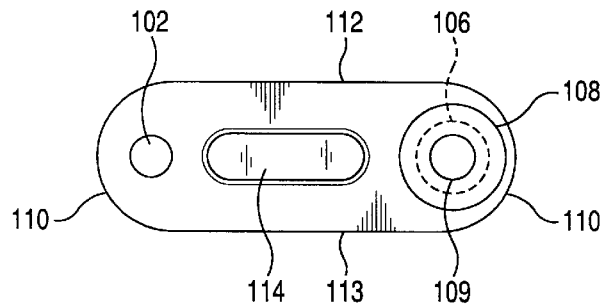
FIG. 2 is a plan view of the tabs forming a part of this invention.
Figure 3:
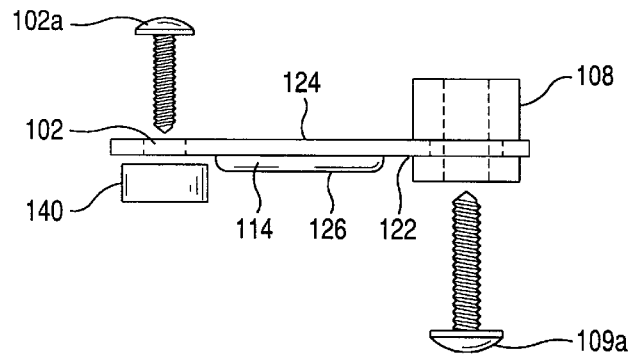
FIG. 3 is a side elevation of the tabs of FIG. 2 forming a part of this invention.

The general shape and description of the mounting feet are further understood with reference to FIGS. 2–3. The mounting feet are preferably formed from a tab 101, a cushioning member 140 and suitable fasteners to secure the tab 101 to the base plate 16 of the invert 100. The tab 101 is defined as having straight upper and lower outer edges 112, 113 as shown in FIG. 2. The left and right edges 110 of the tab 101 are formed from a first radius of curvature taken from the ends of the upper outer edge 112 to the ends of the lower outer edge 113. Located at the point of origin of each radius of curvature are two apertures 102, 106. The first aperture 102 is defined by a second radius of curvature, whereas, the second aperture 106 is defined by a fourth radius of curvature. The apertures 102, 106 penetrate through the entire tab 101, wherein the first aperture 102 is designed to accept a fastener 102a in which to secure the tab 101 to the base plate 16 of the power inverter 100 while the other aperture 106 is designed to accept a spherical dampener 108.

Figure 5:
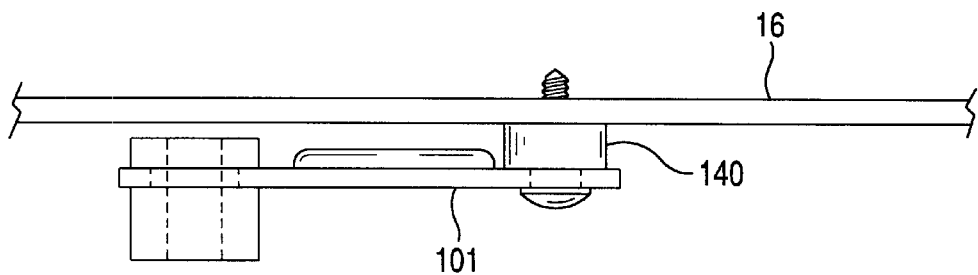
FIG. 5 is an enlarged side elevation of an embodiment of the invention secured to a host body.
Figure 6:
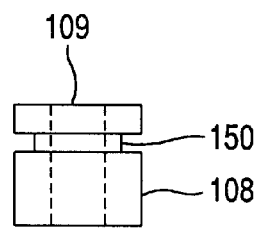
FIG. 6 is a side elevation of the spherical dampener forming a part of the tabs.
Figure 7:
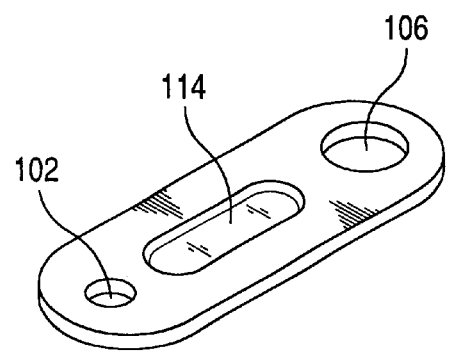
FIG. 7 is a perspective view of the elongated tab.

A small oval depression 114 is provided on the tab that increases the overall strength of the tab 101 against bending. The depression 114 is defined by an opening located on the top surface 124 and extends beyond the bottom surface 122 and terminates with a lower edge 126 as shown in FIGS. 2, 5 and 7. The tab 101 is preferably made from elastomeric electrical insulating material, however, any other suitable material may also be used.

From FIG. 3, the bottom surface 122 of the tab 101 is generally planar but for the protrusion of the depression's bottom surface 126; similarly, the top surface 124 is also generally planar but for the oval depression 114 as defined above.

Figure 4:
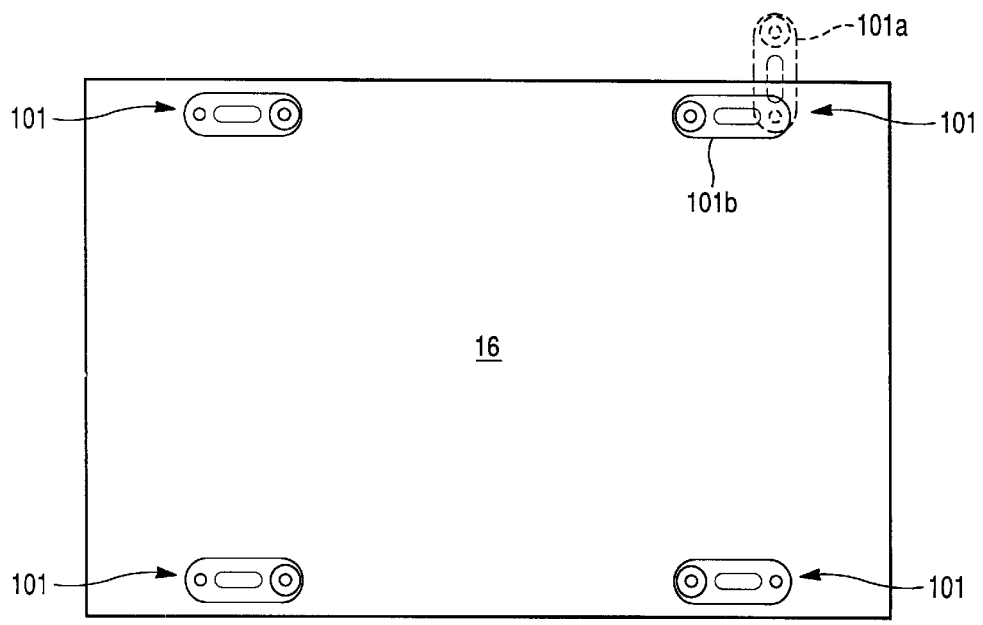
FIG. 4 is a plan view of the invention secured to a host body showing the pivotal features.

As shown in FIGS. 2–4, a spherical dampener 108 is engaged with a second aperture 106. The spherical dampener 108 has an outer circumference defined by a third radius of curvature and an inner passage 109 having about the same second radius of curvature shown in the first aperture 102 of the tab 101. Circumscribing the spherical dampener is a recess 150 in which to engage the internal edge of the second aperture 106 on the tab 101 as shown in FIG. 4. The aperture 106 and the recess 150 are of the same radius of curvature in order to provide a form fit. A passageway 109 passes through the concentric center of the spherical dampener 108 with a second radius of curvature, about the same as the aperture 102 on the tab 101. The passageway 109 on the spherical dampener 108 provides a means through which to fasten on a host body via a fastener 109a passing through the passageway 109 and engaging the host body. The spherical dampener 108 is also preferably made from elastomeric electrical insulator. The spherical dampener's 108 composition is such that vibrations from the host body are absorbed when the power inverter 100 is mounted through the tabs 101. While the above-described spherical dampener 108 has been described with reference to specific radii of curvatures, alternate embodiments may vary depending on user requirements. However, it is preferred that the first aperture 102 of the tab and the passageway 109 within the dampener have the same radius of curvature.

Another embodiment of the invention not depicted in the figures constructs the tab from a single blank, creating the spherical dampener and the tab components as one unit. As previously stated, the preferred material utilized exhibits insulator and dampening characteristics, however the construction material is not limited to only those materials possessing like characteristics.

Referring to FIG. 5, the tab 101 is pivotally connected to a power inverter 100 through the aperture 102 by any number of means, e.g., pins, screws, rivets. A spacer 140 is employed to offset the tab 101 from the power inverter 100. This offset provides an additional dampening effect and reduces the possible of potential damage to the power inverter 100. The offset distance may very depending upon the requirements of the user. Preferably, the tab 101 and the spacer 140 are tightly set, so that a good measure of torsional friction characterizes the swinging action of the tab 101. The spacer may be comprised of any suitable material such that the torsional friction caused by the pivotal movement of the tab will not breakdown the surface of either the tab 101 or the power inverter 100.

As shown in FIG. 4, during storage and shipping of the power inverter, the tab 110 should be in a retracted position 101b to minimize damage to the tab 101 as well as the space occupied by the power inverter 100 and the tabs 101. Whereas, the tab 101 may be pivoted to any open position 101a once a user is prepared to mount the power inverter 100 to a host body (not shown).

Once pivoted to an open position, the tab 101 is ready to secure the power inverter 100 to the host body. The four tabs 101 pivot independently to allow a user to position the tabs in the best location. The passageway 108 located within the spherical dampener 108 is then used as the means to which the tab 101 is affixed to the host body. No one particular attaching mean is preferred over another; the user may utilize alternate attaching means based upon their needs; e.g., pins, screws, rivets, nails.

The features of the invention as explained above provide a solution wherein power inverters may be provided with an attaching means without compromising compact form. More specifically, the tabs 101 are pivotally mounted on the under carriage of a power inverter 100 such that they may be positioned by the user when mounting to a host body. The tabs 101 are preferably made from elastomeric electrical insulator material in order to ensure a proper ground is maintainer as long as the power inverter is secured via the tabs. Additionally, the tabs 101 absorb host body vibration thus lessening the stresses on the power inverter.

While the foregoing invention has been shown and described with reference to the preferred embodiment, it will be understood that various changes in form and detail may be made therein without departing from the spirit and scope of the instant invention. For example, the exact shape of the tabs 101 may be variety to suit the particular base plate 16 and host to which the inverter will be mounted. In addition, while the preferred embodiment utilizes four tabs 101, any suitable number of tabs 101 may be employed for various mounting arrangements.

What is claimed is:

1. A mounting device for mounting a power inverter to another object, comprising:

an elongated tab member affixed to a base plate of said power inverter;

an insulating member disposed at a first end of said elongated tab; and an adjustment system adjusting a relative position of said insulating member relative to said base plate of said power inverter, wherein said elongated tab member is movable between a first position where said insulating member is retracted to a position along said base plate and a second position where said insulating member is cantilevered beyond a peripheral edge of said base plate.

2. The device of claim 1, wherein said elongated tab comprises a depression formed along its length to increase a strength of said tab against bending.

3. The of claim 1, wherein a second aperture is provided at a second end of said elongated to at least partial receive said insulating member.

4. The of claim 1, wherein a first aperture is provided at a first end of said elongated tab to receive a fastener extending between said elongated tab and said base plate.

5. The device of claim 2, wherein said depression is formed along the center of said device.

6. The device of claim 3, wherein said insulating member comprises a central aperture extending a length of said insulating member and a groove circumscribing a perimeter of said insulating member and circumscribing said central aperture.

7. The device of claim 6, wherein said insulating member engages said elongated tab, said groove receiving an edge defining said first aperture.

8. The device of claim 1, further comprising a bushing member disposed between said elongated tab and said base plate.

9. The device of claim 1, wherein said insulating member is formed from an elastomeric electrically insulating material.

10. A mounting device for mounting a power inverter to another object, comprising:
   an elongated tab member comprising a first aperture adjacent a first end and a second aperture adjacent a second end;
   an insulating member disposed within said second aperture; and
   a fastening member passing through said first aperture and fastening said elongated tab to a base plate of said power inverter,
   wherein said elongated tab member is movable between a first position where said insulating member is retracted to a position along said base plate and a second position where said insulating member is cantilevered beyond a peripheral edge of said base plate.

11. The device of claim 10, wherein said elongated tab comprises a depression formed along its length to increase a strength of said tab against bending.

12. The device of claim 10, wherein said first aperture is defined by a first radius of curvature.

13. The device of claim 12, wherein said second aperture is defined by a second radius of curvature.

14. The device of claim 11, wherein said depression is formed along the center of said device.

15. The device of claim 10, wherein said insulating member comprises a central aperture extending a length of said insulating member and a groove circumscribing a perimeter of said insulating member and circumscribing said central aperture.

16. The device of claim 15, wherein said insulating member engages said elongated tab, said groove receiving an edge defining said first aperture.

17. The device of claim 10, further comprising a bushing member adjacent said second aperture and having a bushing aperture aligned with said second aperture.

18. The spherical dampener of claim 10, wherein said insulating member is formed from an elastomeric electrically insulating material.

* * * * *